US008164055B2

(12) United States Patent
Alquier et al.

(10) Patent No.: US 8,164,055 B2
(45) Date of Patent: Apr. 24, 2012

(54) SAMPLE PLATE DESIGNS FOR MALDI AND DESI FOR MOLECULAR IMAGING OF COATED MEDICAL DEVICES ON THE APPLIED BIOSYSTEMS QSTAR/VOYAGER MALDI MASS SPECTROMETER

(75) Inventors: Lori Alquier, Whitehouse Station, NJ (US); Cynthia A. Maryanoff, Forest Grove, PA (US); Gail Reed, Willow Grove, PA (US); Gyorgy Vas, Hillsborough, NJ (US)

(73) Assignee: Cordis Corporation

( * ) Notice: Subject to any disclaimer, the term of this patent is extended or adjusted under 35 U.S.C. 154(b) by 270 days.

(21) Appl. No.: 12/434,113

(22) Filed: May 1, 2009

(65) Prior Publication Data

US 2009/0294695 A1 Dec. 3, 2009

Related U.S. Application Data

(60) Provisional application No. 61/057,330, filed on May 30, 2008.

(51) Int. Cl.
*H01J 49/04* (2006.01)
*H01J 37/20* (2006.01)

(52) U.S. Cl. ........................................................ 250/288

(58) Field of Classification Search .................. 250/288; 269/16; 206/571, 363–370
See application file for complete search history.

(56) References Cited

U.S. PATENT DOCUMENTS

| | | | | |
|---|---|---|---|---|
| 5,808,300 | A * | 9/1998 | Caprioli | 250/288 |
| 6,203,551 | B1 * | 3/2001 | Wu | 606/108 |
| 7,588,642 | B1 * | 9/2009 | Morris et al. | 118/663 |
| 2004/0243214 | A1 * | 12/2004 | Farrell et al. | 623/1.11 |

* cited by examiner

*Primary Examiner* — Jack Berman

(57) ABSTRACT

Holding devices for securely holding medical devices, such as stents, are utilized in performing molecular imaging of the medical devices.

5 Claims, 8 Drawing Sheets

SAMPLE PLATE DESIGNS FOR MALDI AND DESI FOR MOLECULAR IMAGING OF COATED MEDICAL DEVICES ON THE APPLIED BIOSYSTEMS QSTAR/VOYAGER MALDI MASS SPECTROMETER

This claims the benefit of U.S. Provisional Application No. 61/057,330 filed on May 30, 2008.

BACKGROUND OF THE INVENTION

1. Field of the Invention

The present invention relates to the analysis of medical devices, and more particularly to devices for holding medical devices during analysis.

2. Discussion of the Related Art

Controlling the elution properties of an active pharmaceutical ingredient (API) from a polymeric matrix is dependent understanding the distribution of the API within the matrix. The formulation and manufacturing process can alter the distribution of the components. Specifically for drug-coated stents, determining the distribution of the API within the matrix and across the stent will enable better understanding of the API release profile.

MALDI mass spectrometry refers to an instrumental technique that allows for molecular imaging of the surface of a matrix coated sample. MALDI mass spectrometry combined with imaging capability is a technique for analyzing a sample when the sample is moved by a stepping motor in sub micrometer steps (usually 10-100 μm step size) and scanned by a high energy laser source which ionizes the spot of the surface in each step. The generated ions are transmitted into a mass spectrometer that records the mass spectrum. Special data analysis software converts the spectral information into an image map. The main advantage of the technique is that the entire mass range of each stepping spot can be collected. The data analysis software can theoretically generate a molecular image for each discrete m/z value between the lower and upper mass limit of the mass spectrometer. Another possible way to generate data is to collect selective data packages in product ion scan mode to eliminate the possible chemical interferences in the sample.

A critical aspect of MALDI is coating the sample with a matrix that helps to ionize and vaporize the sample. In order to coat the samples, they need to be fixed onto a sample holder. All current sample holder designs are flat surfaces or mostly flat surfaces that can not accommodate medical devices that are several millimeters in diameter. Several attempts were made to attach the stents to the flat or mostly flat surfaces using double sided tapes or acrylate glue to hold the stents. However, these means of fixing the stents was not viable for two reasons. First the glue or tape sometimes released the stent during the application of the matrix. Another issue is theoretically the glue or the tape can cause chemical and spatial interferences. The chemical interferences are due to possible ionization of the chemicals in the glue and tape, and the spatial interferences prevent imaging of the complete length of stents since the glue or taps covers part of the stent.

SUMMARY OF THE INVENTION

The invention of the sample plate designs described in this application provide a way to analyze medical devices, more specifically, an application for drug-coated stents was presented. The sample plates make it possible to develop a molecular imaging method for drug eluting stents using a high vacuum MALDI laser ionization source. With the development of this application it is possible to investigate the distribution of ionizable drugs, polymers, or related degradation products on the surface of the stents. The invention allows for the development of molecular imaging methods without introducing artificial chemical interferences. Molecular imaging of drug eluting medical devices allows us to collect molecular information directly from the surface of the device and by tuning the laser energy collect molecular information in depth as well. When MALDI is applied to an object, provided the matrix is optimized for the sample being analyzed, an image of a particular chemical species across the length of the object can be obtained, thereby generating a visual image of the distribution of the chemical species. For a surface coated object this provides a method whereby the molecular distribution of the surface coating can be visualized.

Introducing molecular imaging capability can improve upon patient safety by specific knowledge of each component and it's relationship to performance.

BRIEF DESCRIPTION OF THE DRAWINGS

The foregoing and other features and advantages of the invention will be apparent from the following, more particular description of preferred embodiments of the invention, as illustrated in the accompanying drawings.

DETAILED DESCRIPTION OF THE PREFERRED EMBODIMENTS

The present invention disclosure describes a new design of sample plates to be used for imaging three-dimensional coated or un-coated objects on the Applied Biosystems (ABI) Qstar or Voyager or ABI 4700 mass analyzers. The ABI mass analyzers are used for matrix assisted laser desorption ionization (MALDI) analyses. Typical samples for MALDI analysis are thin slices of biological samples or thin films layered on a metal coupon. There are no literature applications demonstrating the imaging of a medical device by MALDI. The sample plates presented in this patent application were designed to hold coronary stents during MALDI-ToF analysis as well as during the matrix application process.

The same sample plates can also be used for molecular imaging work by DESI (desorption electrospray ionization).

Prior to MALDI analyses, samples must be sprayed with a matrix that enables the ionization and vaporization of the samples. When MALDI is applied to an object, provided the matrix is optimized for the sample being analyzed, an image of a particular chemical species across the length of the object can be obtained, thereby generating a visual image of the distribution of the chemical species. For a surface coated object this provides a method whereby the molecular distribution of the surface coating can be visualized.

The coating of the samples by the matrix is performed apart from the MALDI, by an automated sprayer ensuring an evenly distributed matrix coating on the samples. During the coating process the sample plates hold the samples. Once the coating is completed, the matrix covered sample plate is placed into a plate holder and into the mass analyzer sample compartment.

In this disclosure, five different sample plate designs were developed and tested for the analysis of drug-coated stents. The first three designs consist of a top and bottom plate, while the last two plate designs consist of a single plate. The following designs were evaluated:

1. Design 416-094B and 416-094T—comprised of a top and bottom plate
2. Design 1102B and 1102T—comprised of a top and bottom plate
3. Design 442-180B and 442-180T—comprised of a top and bottom plate
4. Design 442-181—comprised of a single sample plate
5. Design 466-157—comprised of a single sample plate All of the sample holder designs performed the requirement of holding the stents in place during the matrix coating and imaging analysis. The first three exemplary designs can be made of any metal with dimensions of 57.5×57.5×0.7-1.0 mm or magnetic metal with dimensions of 45×45×0.7 mm. The last two designs must be made of magnetic metal with dimensions of 45×45×0.7 mm.

Design 416-094B and 416-094T

Figure 1:
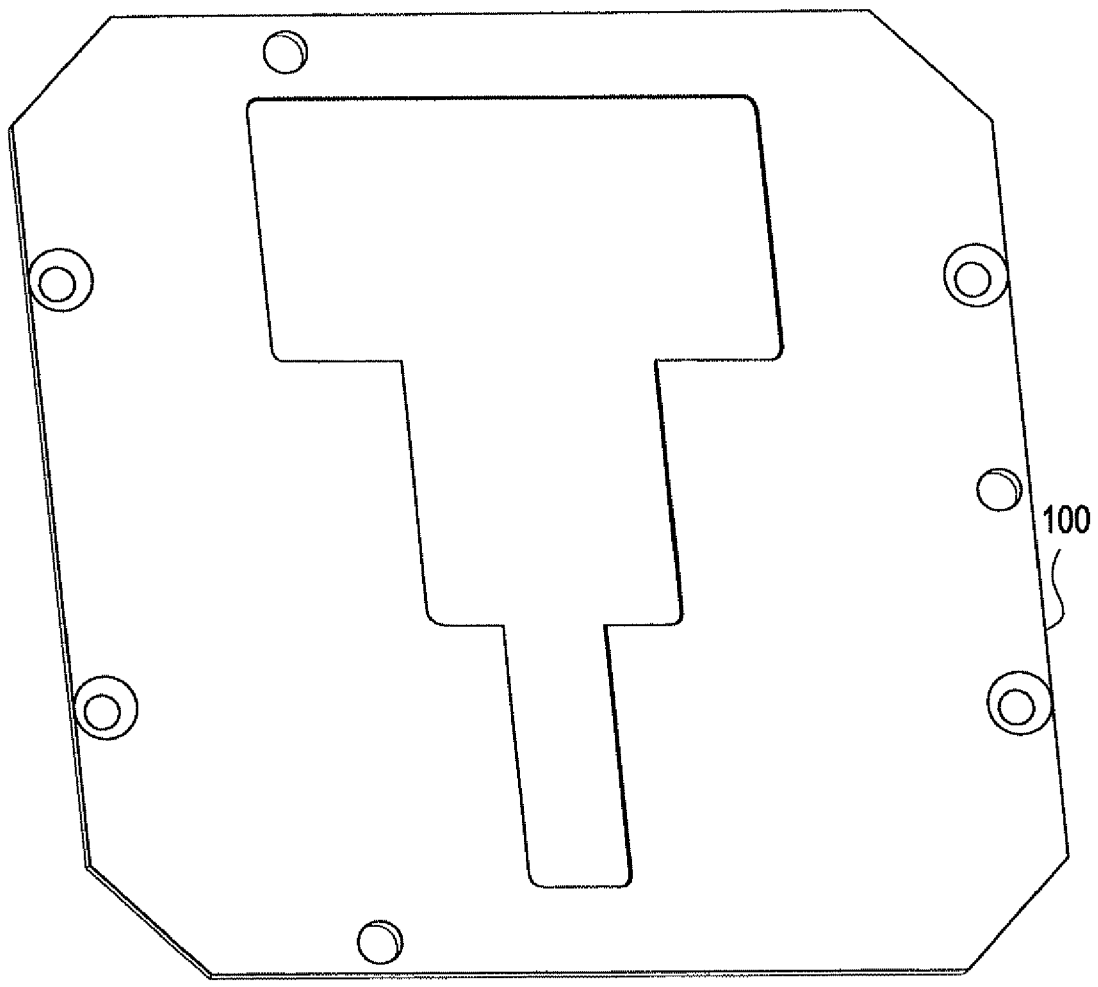
FIG. 1 is a diagrammatic representation of a bottom plate of a first exemplary holding device in accordance with the present invention.
Figure 2:
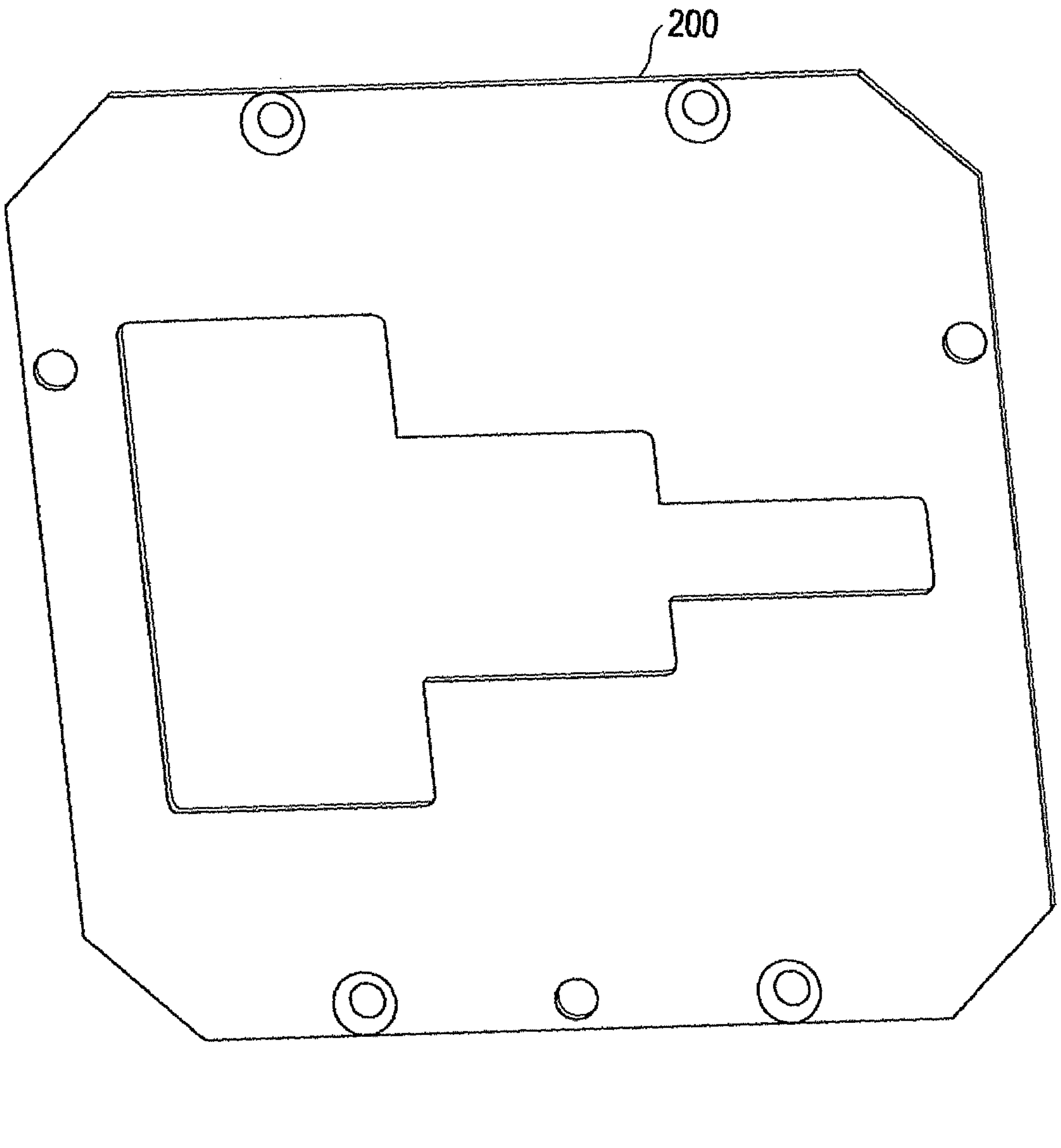
FIG. 2 is a diagrammatic representation of a top plate of a first exemplary holding device in accordance with the present invention.

Design 416-094 is a combination of a bottom plate 100 FIG. 1 and a top plate 200 illustrated in FIG. 2. The bottom and top plates 100, 200 are held together by screws or other suitable means on a standard ABI Qstar or Voyager plate holder. The bottom plate 100 contains 0.4 mm deep grooves and the top plate contains slots that align with the grooves in the bottom plate. Two different dimension slots and grooves were prepared in the plates 100, 200. The slots and grooves are 1.2 mm×8 mm and 1.2 mm×33 mm. The slots contain vertical pins at periodic intervals across the length of the slots that assist in holding the sample. The stents were placed into the grooves on the bottom plate 100 and the top plate 200 was placed on top of the stents. The laser beam was aligned with the matrix-covered stents and the samples were analyzed.

Design 1102B and 1102T

Figure 3:
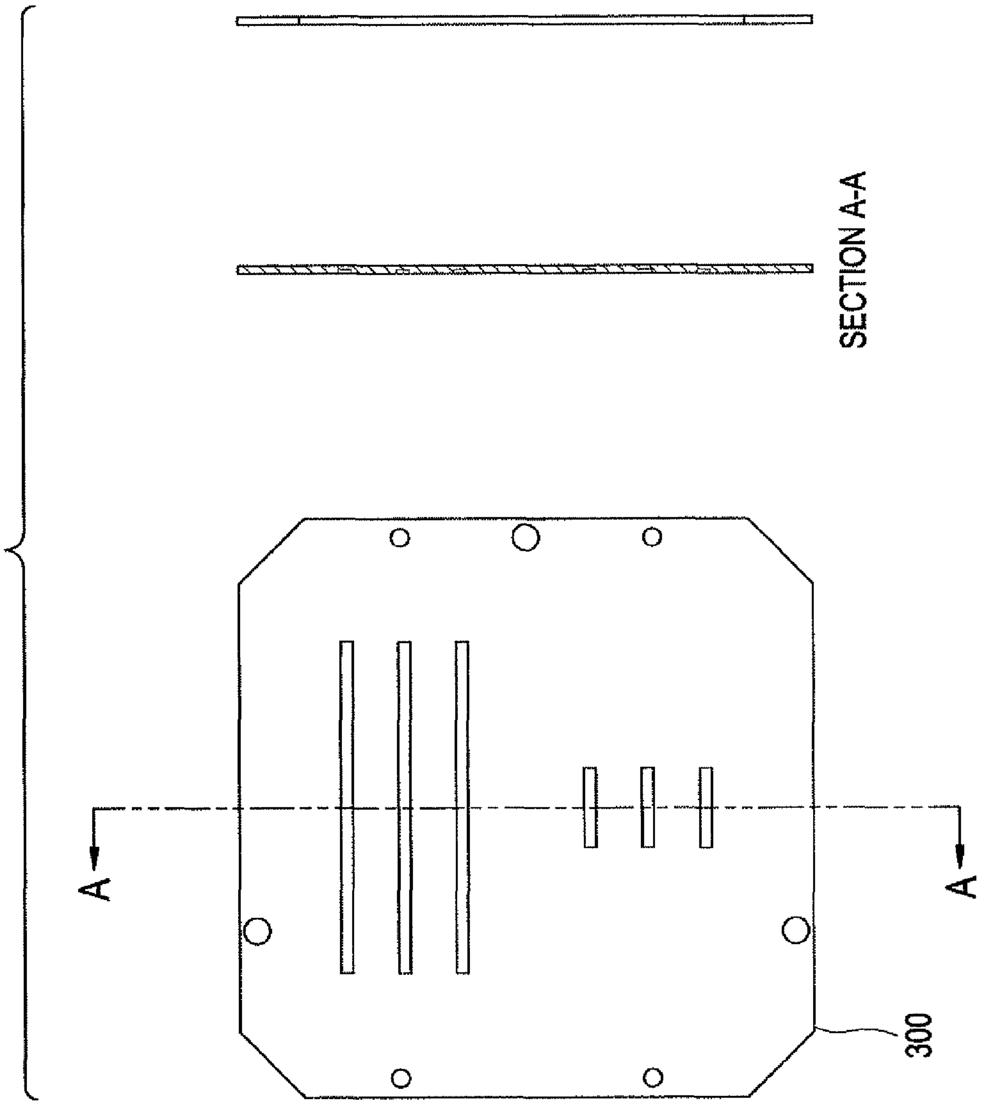
FIG. 3 is a diagrammatic representation of a bottom plate of a second exemplary holding device in accordance with the present invention.
Figure 4:
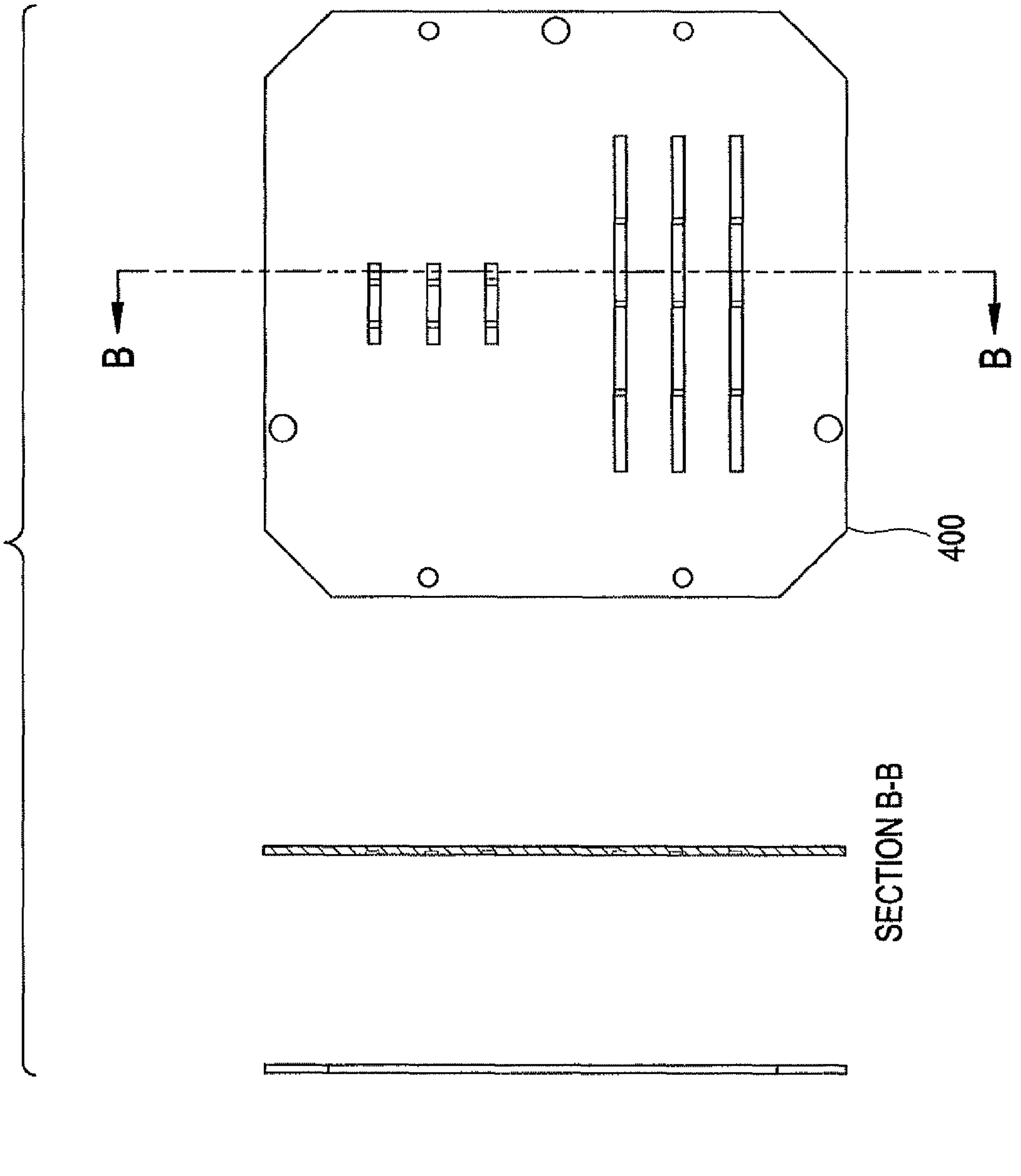
FIG. 4 is a diagrammatic representation of a top plate of a second exemplary holding device in accordance with the present invention.

Design 1102 is a combination of a bottom plate 300 illustrated in FIG. 3 and a top plate 400 illustrated in FIG. 4. The bottom plate 300 is a solid piece of metal that contains several machined sections. The machined sections are 0.4 mm deep and lengths of 6, 15, and 300 mm. The top plate 400 is a piece of metal with openings that are 6, 15, and 33 mm long and align with the same sized sections of the bottom plate 300. The different size stents are placed in the appropriately sized machined section of the bottom plate 300. The top plate 400 is placed on top of the stents. The top and bottom plates 300, 400 are held together by screws or other suitable means on a standard ABI Qstar or Voyager plate holder.

Design 442-180B and 442-180T

Figure 5:
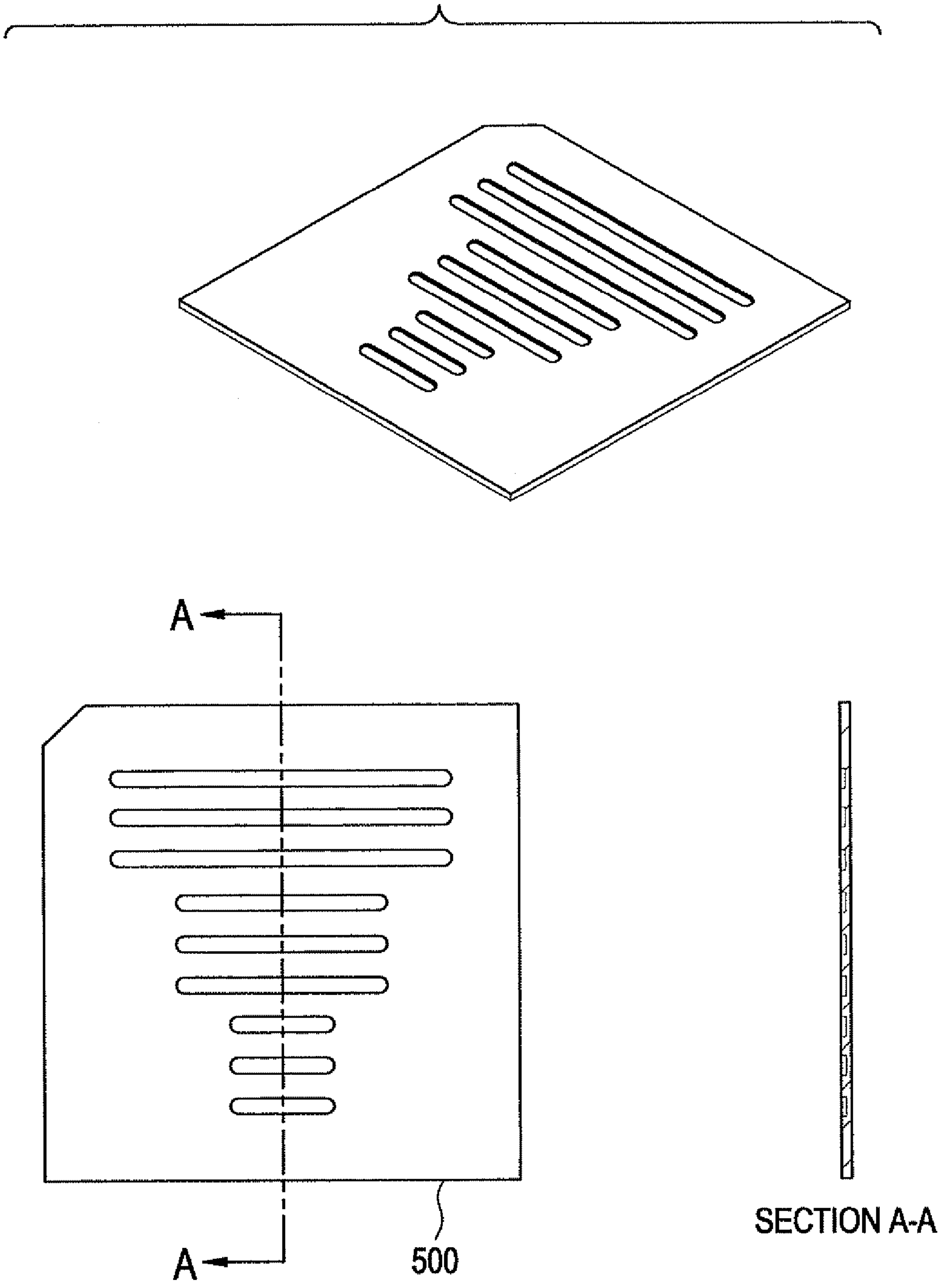
FIG. 5 is a diagrammatic representation of a top plate of a third exemplary holding device in accordance with the present invention.
Figure 6:
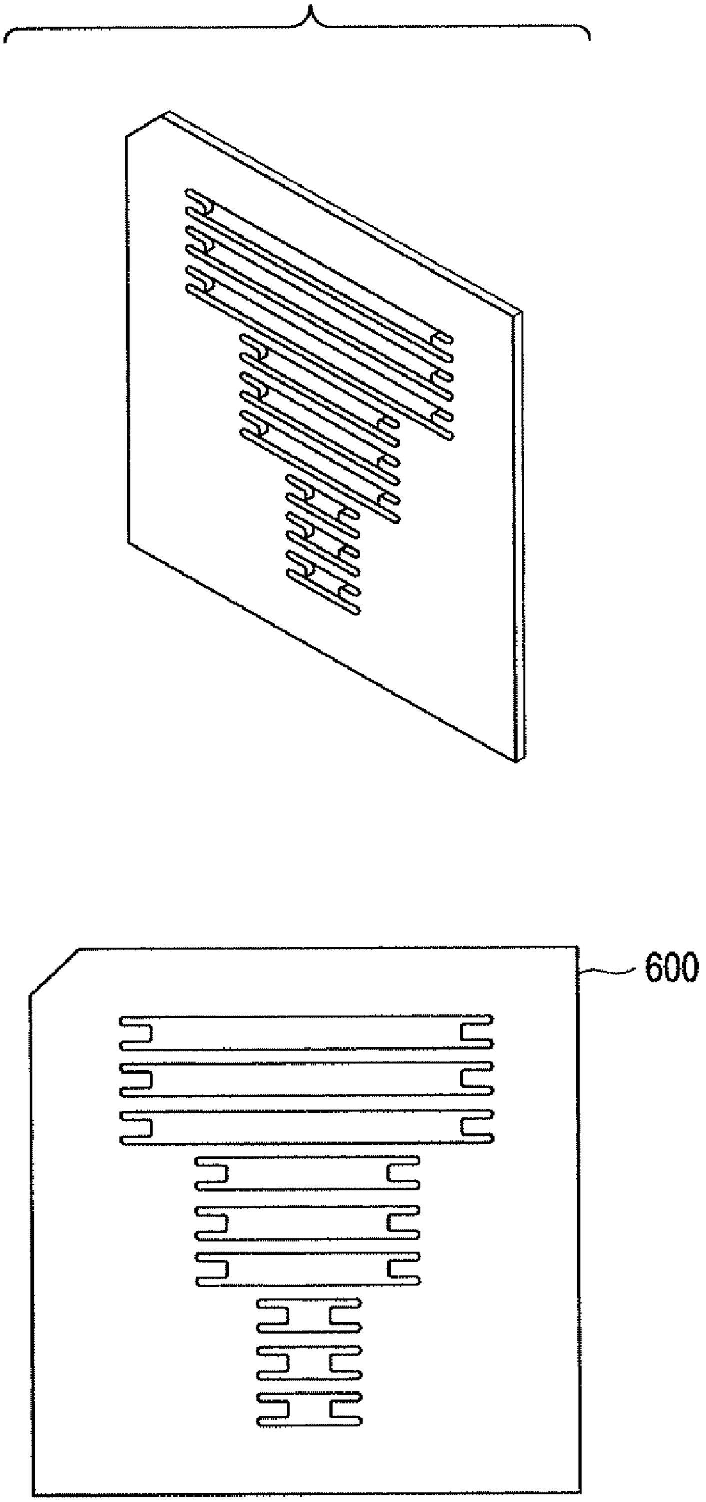
FIG. 6 is a diagrammatic representation of a bottom plate of a third exemplary holding device in accordance with the present invention.

Design 442-180 is a combination of a bottom plate 500 illustrated in FIG. 5 and a top plate 600 illustrated in FIG. 6, but the plates are welded together. The bottom plate 500 is a solid piece of metal, which contains 0.4 mm deep grooves of varying lengths (6, 15, and 33 mm). The top plate 600 is made from metal and contains slots of varying lengths (6, 15, and 33 mm) that align with the grooves in the bottom plate 500. The different size stents are placed in the grooves in the bottom plate and the top plate 600 is placed on top of the stents. The plate is compatible with a magnetic or standard ABI Qstar or Voyager plate holder.

Design 442-181

Figure 7:
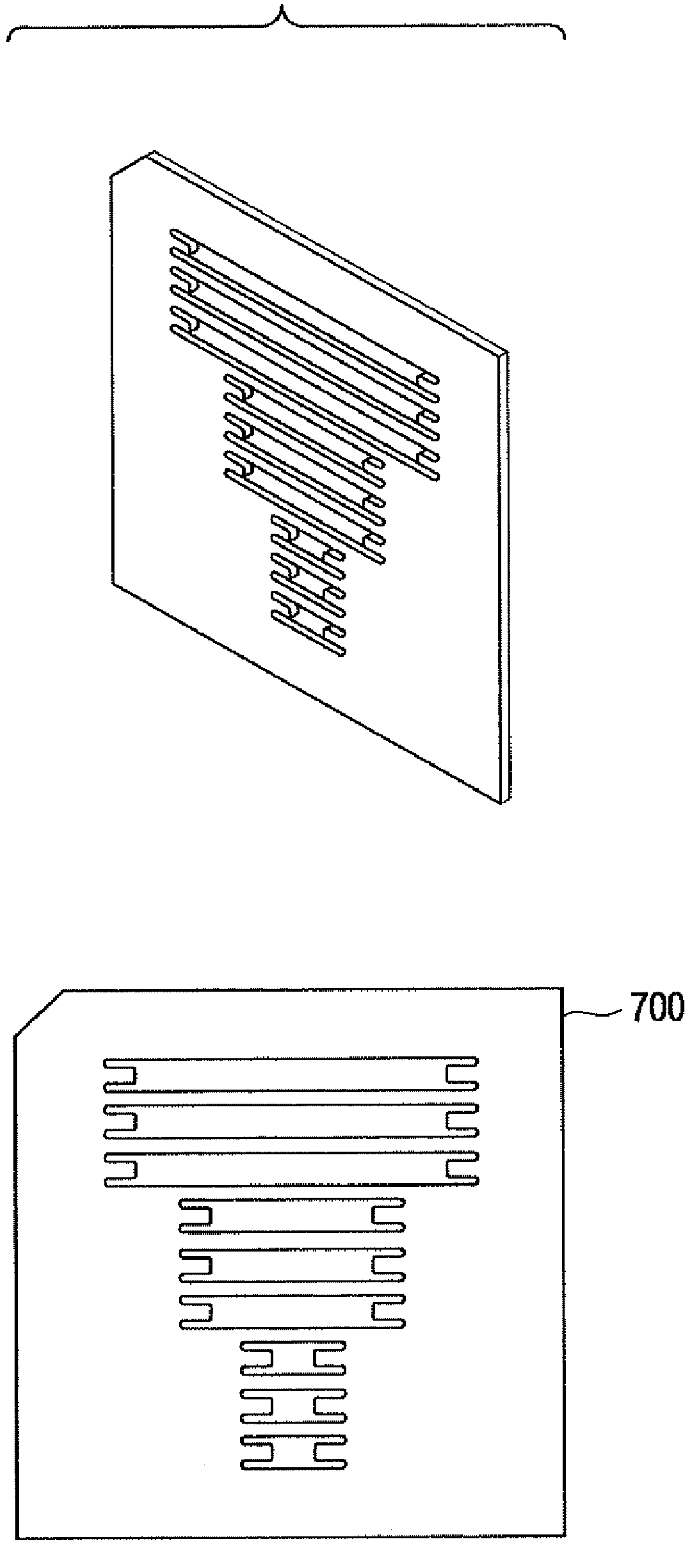
FIG. 7 is a diagrammatic representation of a fourth exemplary holding device in accordance with the present invention.

Design 442-181 (FIG. 7) is a single piece design. The plate 700 is made from a solid piece of metal. Slots of varying lengths (6, 15, and 33 mm) and 2 mm wide were cut into the plate 700. The slots have 2-3 mm pins extending from the short sides. The stents are placed into the slots and "hung" on the pins to hold them in place.

Design 466-157

Figure 8:
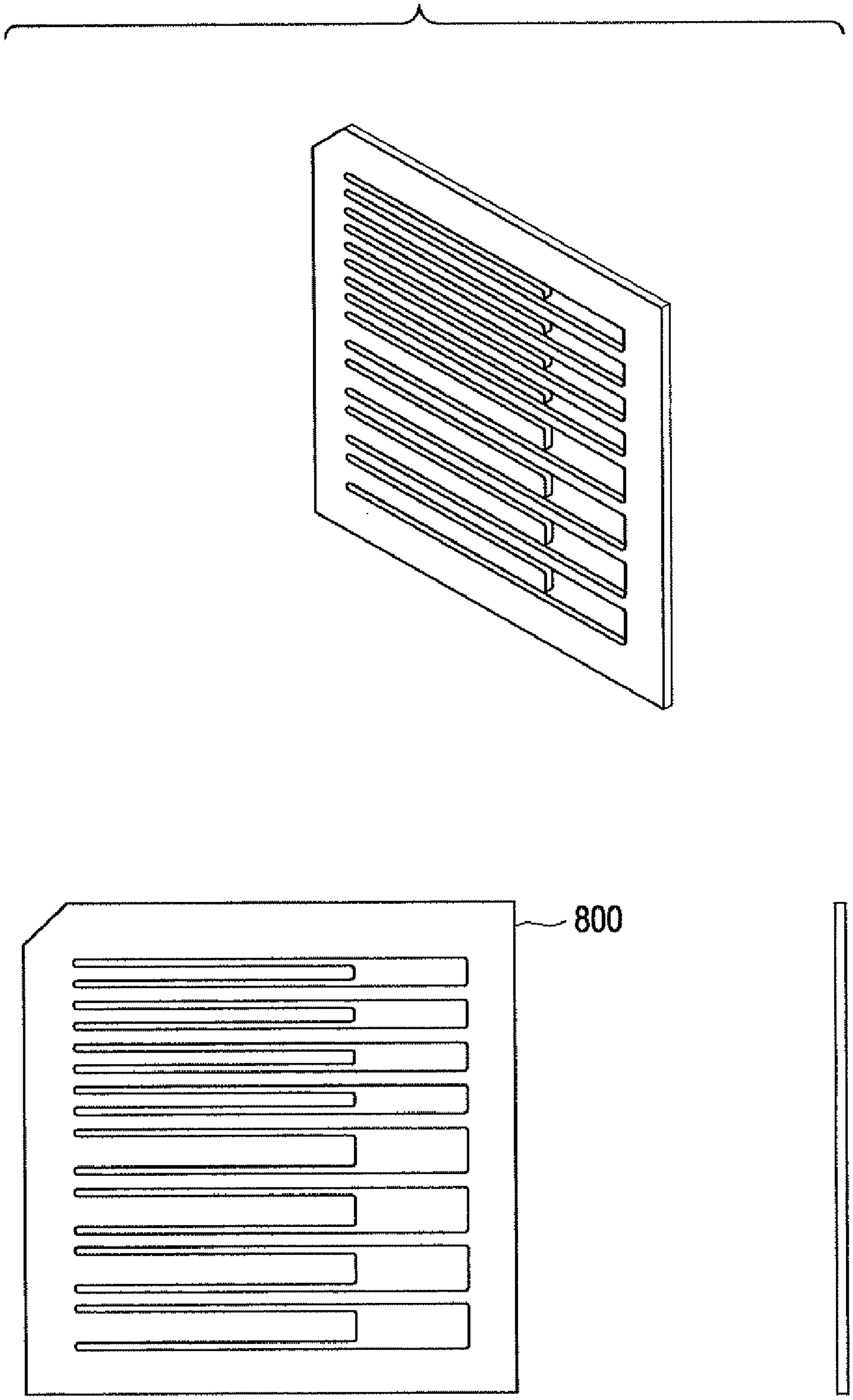
FIG. 8 is a diagrammatic representation of a fifth exemplary holding device in accordance with the present invention.

Design 466-157 (FIG. 8) is a single piece design. The plate 800 is made from a single piece of metal. The different size stents are placed between the pins of the plate 800. The plate 800 is compatible with a magnetic ABI Qstar or Voyager plate holder. The pins of the plate (466-157) are 35 mm long and 25 mm wide with 1.2 mm pins and 4.0 mm wide with 25 mm pins. The stents are placed over the various sizes of pins of the plate 800 that hold the stents during the spraying and the imaging process. The "over the pin" design prevents the stent from bending, during the imaging process.

Although shown and described is what is believed to be the most practical and preferred embodiments, it is apparent that departures from specific designs and methods described and shown will suggest themselves to those skilled in the art and may be used without departing from the spirit and scope of the invention. The present invention is not restricted to the particular constructions described and illustrated, but should be constructed to cohere with all modifications that may fall within the scope of the appended claims.

What is claimed is:

1. A holding device for stents, the holding device comprising:

a substantially planar, metallic bottom member having at least one groove configured for holding at least one stent; and a substantially planar, metallic top member having at least one slot aligned with the at least one groove when the top member is releasably affixed to the bottom member, the at least one slot including pins aligned along the length thereof and configured for holding the at least one stent in position, wherein the holding device is configured to hold the at least one stent and is further configured to be retained within a molecular imaging apparatus, the slot in the plate having a length corresponding to a length of the at least one stent to allow direct unobstructed imaging of the stent.

2. A holding device for stents, the holding device comprising:

a substantially planar, metallic bottom member having at least one machined section configured for holding at least one stent; and a substantially planar, metallic top member having at least one opening aligned with the at least one machined section when the top member is releasably affixed to the bottom member, wherein the holding device is configured to hold the at least one stent and is further configured to be retained within a molecular imaging apparatus, the opening having a length corresponding to a length of the at least one stent to allow direct unobstructed imaging of the stent.

3. A holding device for stents, the holding device comprising:

a substantially planar, metallic bottom member having at least one groove configured for holding at least one stent; and a substantially planar, metallic top member having at least one slot aligned with the at least one groove when the top member is affixed to the bottom member, wherein the holding device is configured to hold the at least one stent and is further configured to be retained within a molecular imaging apparatus, the slot in the plate having a length corresponding to a length of the at least one stent to allow direct unobstructed imaging of the stent.

4. A holding device for stents, the holding device comprising a single substantially planar, metallic member having at least one slot and multiple pins, the multiple pins being configured to hang the stent thereon by engaging an interior portion of the at least one stent and, wherein the holding device is configured to hold the at least one stent and is further configured to be retained within a molecular imaging apparatus, the at least one slot having a length corresponding to a length of the at least one stent to allow direct unobstructed imaging of the stent.

5. A holding device for stents, the holding device comprising a single substantially planar, metallic member, having a plurality of pins protruding therefrom on which the stent is secured, wherein the pins are configured to engage an interior portion of the at least one stent and wherein the holding device is configured to hold the at least one stent and is further configured to be retained within a molecular imaging apparatus, the device configured to allow direct unobstructed imaging of the stent.

* * * * *